(12) United States Patent
Carson

(10) Patent No.: US 8,189,902 B1
(45) Date of Patent: May 29, 2012

(54) CREATING AN XY IMAGE PATTERN ON A ROTATING SUBSTRATE

(75) Inventor: Douglas M. Carson, Cushing, OK (US)

(73) Assignee: Doug Carson & Associates, Cushing, OK (US)

( * ) Notice: Subject to any disclaimer, the term of this patent is extended or adjusted under 35 U.S.C. 154(b) by 539 days.

(21) Appl. No.: 12/341,972

(22) Filed: Dec. 22, 2008

Related U.S. Application Data

(60) Provisional application No. 61/016,373, filed on Dec. 21, 2007.

(51) Int. Cl.
*G06K 9/00* (2006.01)

(52) U.S. Cl. ....................................... 382/141

(58) Field of Classification Search ........... 382/141–182
See application file for complete search history.

(56) References Cited

U.S. PATENT DOCUMENTS

| | | | |
|---|---|---|---|
| 4,110,594 A | 8/1978 | May | |
| 5,216,247 A | 6/1993 | Wang et al. | |
| 6,028,288 A | 2/2000 | Moriike | |
| 6,229,926 B1 | 5/2001 | Chui et al. | |
| 6,252,241 B1 | 6/2001 | Sarussi | |
| 6,264,295 B1 | 7/2001 | Bradshaw et al. | |
| 6,986,559 B1 | 1/2006 | Youngberg et al. | |
| 7,284,804 B2 | 10/2007 | Jones et al. | |
| 7,382,711 B2 * | 6/2008 | Chauhan et al. ............... | 369/126 |
| 2005/0179768 A1 | 8/2005 | Onodera et al. | |
| 2007/0160932 A1 * | 7/2007 | Kojima ......................... | 430/296 |

* cited by examiner

*Primary Examiner* — Michael P Stafira

(74) *Attorney, Agent, or Firm* — Hall Estil Attorneys at Law

(57) ABSTRACT

Various embodiments of the present invention are generally directed to a method and apparatus for transferring an XY image to a rotating substrate, such as a semiconductor substrate, storage medium, etc. An XY image pattern comprising a plurality of image elements is divided into a matrix of adjacent tiles. A write beam is used to write the XY image pattern to a rotating substrate by defining a radial path at a selected radius of the rotating substrate, identifying the tiles of said matrix that intersect said radial path, and writing a portion of the XY image pattern at the selected radius using image elements from the identified tiles.

20 Claims, 7 Drawing Sheets

CREATING AN XY IMAGE PATTERN ON A ROTATING SUBSTRATE

RELATED APPLICATIONS

The present application makes a claim of domestic priority to U.S. Provisional Patent Application No. 61/016,373 filed Dec. 21, 2007, the contents of which are hereby incorporated by reference.

BACKGROUND

In the general area of lithography, the transfer of an image to an associated substrate (medium) can be carried out by creating an XY pattern (2-dimensional array) of the desired image whereby X is the number of image elements along one axis and Y is the number of image elements along a second axis. The XY image is then used to expose the substrate in such a way as to write or otherwise transfer the image to the substrate.

In the case of high resolution lithography such as used in the manufacture of semiconductors, the size of each image element can be measured in very small units, such as nanometers, nm ($10^{-9}$ m). For example, an overall image with an X dimension of 50 micrometers, nm ($10^{-6}$) and a Y dimension of 50 um which contains 1000 image elements in the X dimension and 2000 image elements in the Y dimension will have an image element size of X=50/1000=50 nm and Y=50/2000=25 nm. That is, each element, or pixel, in the image would be 50×25 nm in size.

This XY image can be applied to a substrate using an XY stepper mechanism whereby the substrate is stepped in the X dimension to expose one line of the substrate at a time. In the above example, this would require 1000 steps of 50 nm each step for a total X distance of 50 um. The substrate would then be stepped in the Y dimension and the next line of the XY image would be exposed. Alternatively, instead of stepping the substrate, the substrate could be maintained in a stationary position and the exposure beam could be stepped in the XY dimensions.

While operable, there are a number of limitations with the foregoing approach. One limitation relates to the excessive memory requirements to store relatively large, high definition images. For example, a 100 mm×100 mm image which has a resolution of 5 nm in both dimensions will contain 100,000,000/5=20,000,000 image elements in both dimensions. This results in a total file size of about 400 terabits, or 50 terabytes of information. Storage and accessing of such a large file can be problematic. Another limitation with the transfer of images as set forth above is the relative expense and complexity of substrate/beam stepper systems for the required resolution and range to accommodate such relatively large images.

SUMMARY

Accordingly, various embodiments of the present invention are generally directed to a method and apparatus for transferring an XY image to a rotating substrate, such as a semiconductor substrate, storage medium, etc.

In accordance with some embodiments, the method generally comprises dividing an XY image pattern comprising a plurality of image elements into a matrix of adjacent tiles, and using a write beam to write the XY image pattern to a rotating substrate by defining a radial path at a selected radius of the rotating substrate, identifying the tiles of said matrix that intersect said radial path, and writing a portion of the XY image pattern at the selected radius using image elements from the identified tiles.

In accordance with other embodiments, the apparatus generally comprises a write system which divides an XY image pattern into a matrix of adjacent tiles and which modulates a write beam to write the XY image pattern to a rotating substrate by defining a radial path at a selected radius of the rotating substrate, identifying the tiles of said matrix that intersect said radial path, and writing a portion of the XY image pattern at the selected radius using image elements from the identified tiles.

In accordance with still further embodiments, the apparatus generally comprises a rotating substrate, and first means for writing an XY image pattern to the rotating substrate by selectively accessing a matrix of tiles formed from said image pattern.

BRIEF DESCRIPTION OF THE DRAWINGS

FIG. 4 shows the tiles of FIG. 3 with a first radial overlay representative of a first concentric areal extent of the substrate.

FIG. 5 shows the tiles of FIG. 4 with a second radial overlay concentric to the first overlay.

DETAILED DESCRIPTION

Reference will now be made in detail to various embodiments of the invention as discussed below and generally illustrated in the associated drawings. Each example is provided by way of explanation, and is not meant as a limitation. For example, features illustrated or described as part of one embodiment may be used with another embodiment to yield still a different embodiment. Other modifications and variations to the described embodiments are also contemplated within the scope and spirit of the claimed subject matter.

Figure 1:
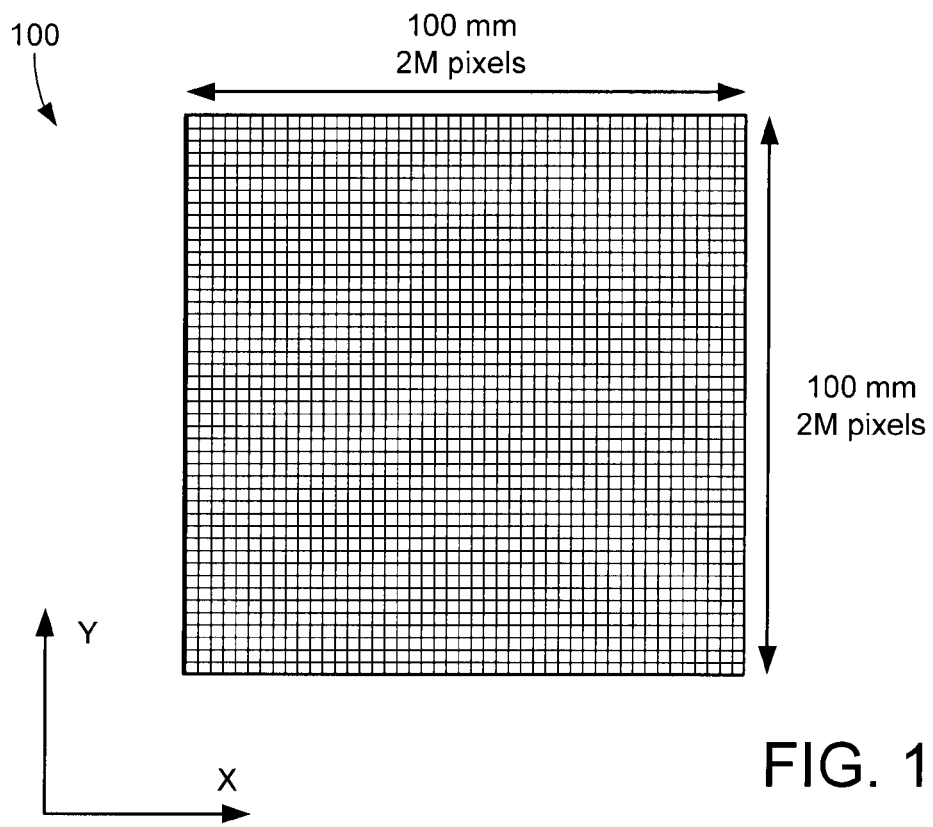
FIG. 1 provides an exemplary XY image pattern that can be transferred to a substrate in accordance with various embodiments of the present invention.

FIG. 1 shows an exemplary XY image pattern file 100 ("image pattern"). It is contemplated that image pattern 100 comprises 20,000,000 X pixels and 20,000,000 Y pixels for a total of 400 Terapixels (400×$10^{12}$ pixels), which equates to a file size of about 500 Gbytes (500×10⁹ bytes). The image file provides an overall transferred size of 100 millimeters, mm (100×10⁻³ m) in the X direction and 100 mm in the Y direction. Each pixel accordingly has an individual dimensional size of 5 nm×5 nm (100 mm/20,000,000).

One method of transferring the image pattern 100 to a substrate (not shown) could be through the use of a stepper assembly, which will be recognized by those skilled in the art as a mechanism for providing very precise incrementally advanced steps of movement. Such stepper assemblies could be configured to step the substrate and/or the recording beam.

In such an approach, the substrate could be positioned so that the top left corner of the substrate was under the recording beam. Upon writing the first pixel in the first line of 20,000,000 X pixels, the substrate would be stepped by a distance corresponding to one X pixel, whereupon the second pixel in the first X line of pixels would be written. This stepping/writing procedure would continue in the X direction until the entire first line of 20,000,000 X pixels had been recorded to the substrate. The substrate would then be stepped by a distance corresponding to one Y pixel, whereupon the second line of 20,000,000 X pixels would be written either from left to right or right to left using the same X step/write procedure. This stepping process can be repeated until the entire substrate had been stepped through.

Some XY recording systems of the related art may use a combination of substrate stepping and recording beam deflection. Regardless of stepping or deflecting, the substrate is still written in a substantially XY manner. While operable, as noted above such approaches can be time and resource intensive, particularly for relatively large image files such as depicted in FIG. 1.

Figure 2:
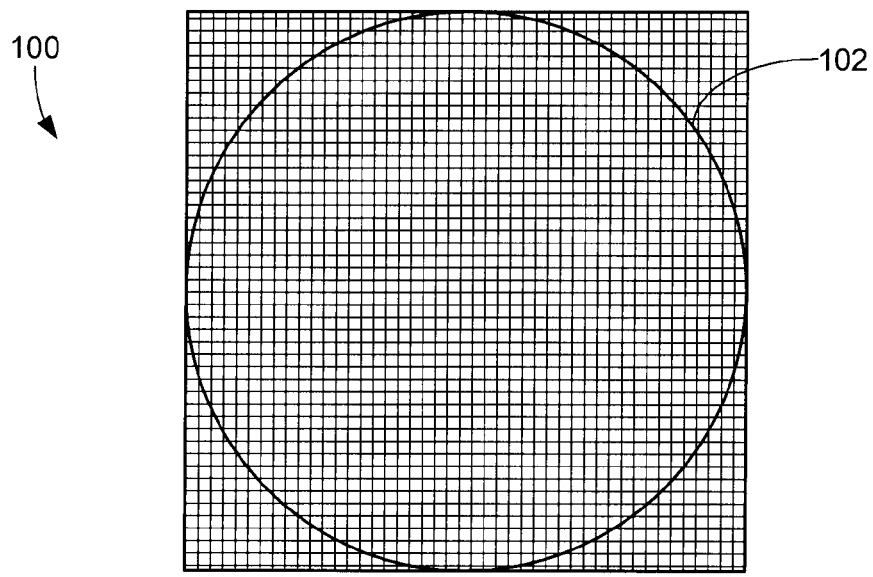
FIG. 2 shows the XY image pattern of FIG. 1 in conjunction with a circular substrate overlay representing a substrate to which a medial portion of the image pattern is to be transferred.
Figure 3:
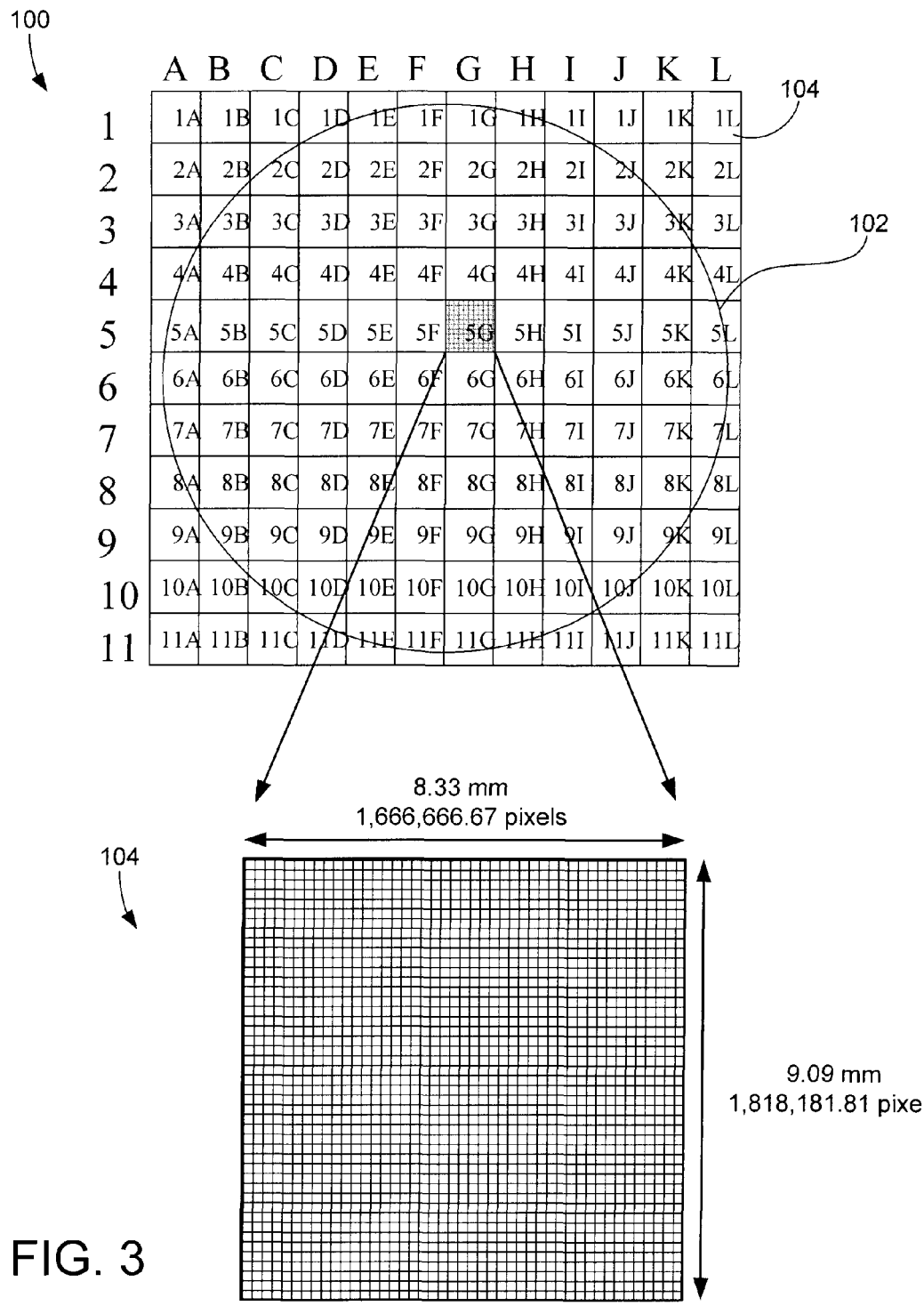
FIG. 3 depicts the XY image pattern of FIG. 1, broken up into an array of adjacent, smaller tiles (tile files).

Accordingly, FIG. 2 provides the image pattern 100 in conjunction with a circular substrate overlay 102. The overlay 102 represents the corresponding outline of a substrate (not separately shown) having a diameter of nominally 100 mm. As explained below, the various embodiments disclosed herein can advantageously transfer image data from an image pattern such as 100 onto this or other types and shapes of substrates. Generally, instead of stepping the substrate and/or the beam in an XY manner, the substrate will be rotated about a central axis. As the substrate rotates, an image beam will transfer image elements from the image pattern thereto.

One issue associated with recording such image data to a rotating substrate is the fact that the input XY pattern image file 100 may be stored in a manner designed for XY stepping systems. One skilled in the art could convert the XY pattern image into a polar coordinate image. However the conversion will yield an approximation of the desired pattern, and therefore induce undesired distortion.

This distortion could be reduced by oversampling the input XY pattern file. For example the 50 nm input file described in FIG. 1 could be created with a resolution 10 times greater in both X and Y dimensions, which would yield a file 100 times larger. This would require an input file size of around 50,000 Gbytes and would also require a mechanical recording device with extremely high resolution and stability.

By contrast, various embodiments presented herein utilize mechanical recording devices with resolution capability close to the requirements of the XY pattern file. This will allow costs to be lower on the recording device as well as higher speed recording for the entire XY pattern. Nevertheless, there are several other remaining issues that generally require resolution in order to accurately record an XY pattern image such as 100 onto a rotating recording substrate as depicted in FIG. 2.

A first problem is one of XY pattern image file handling. In conventional stepper recording systems, the XY pattern file is easily read sequentially. For example an XY pattern file can be organized such that X line 1 is the first sequence of recording bits, followed by X line 2, X line 3 and so forth. The stepping recording device will position the recording substrate to X line 1 and record the first line of data from the input file, then reposition to X line 2 and record the second line of data from the input file. Thus the file can be read sequentially from a main file storage device while recording.

By contrast, a rotating recording will generally require relatively rapid random access to the entire 500 Gbytes of XY pattern image data. This is because the recording path would not generally follow the linear XY path described above. This requirement to have rapid random access to the entire pattern image makes tape and hard drive access very problematic when feeding a rotating recording device. It would be possible to load the entire 500 Gbyte XY pattern image into RAM which would provide better random access speed than tape or HDD. Regardless of the storage medium utilized, it is very problematic to randomly access data contained in a single 500 Gbyte file at sustained data rates required for recording.

Figures 4, 5:
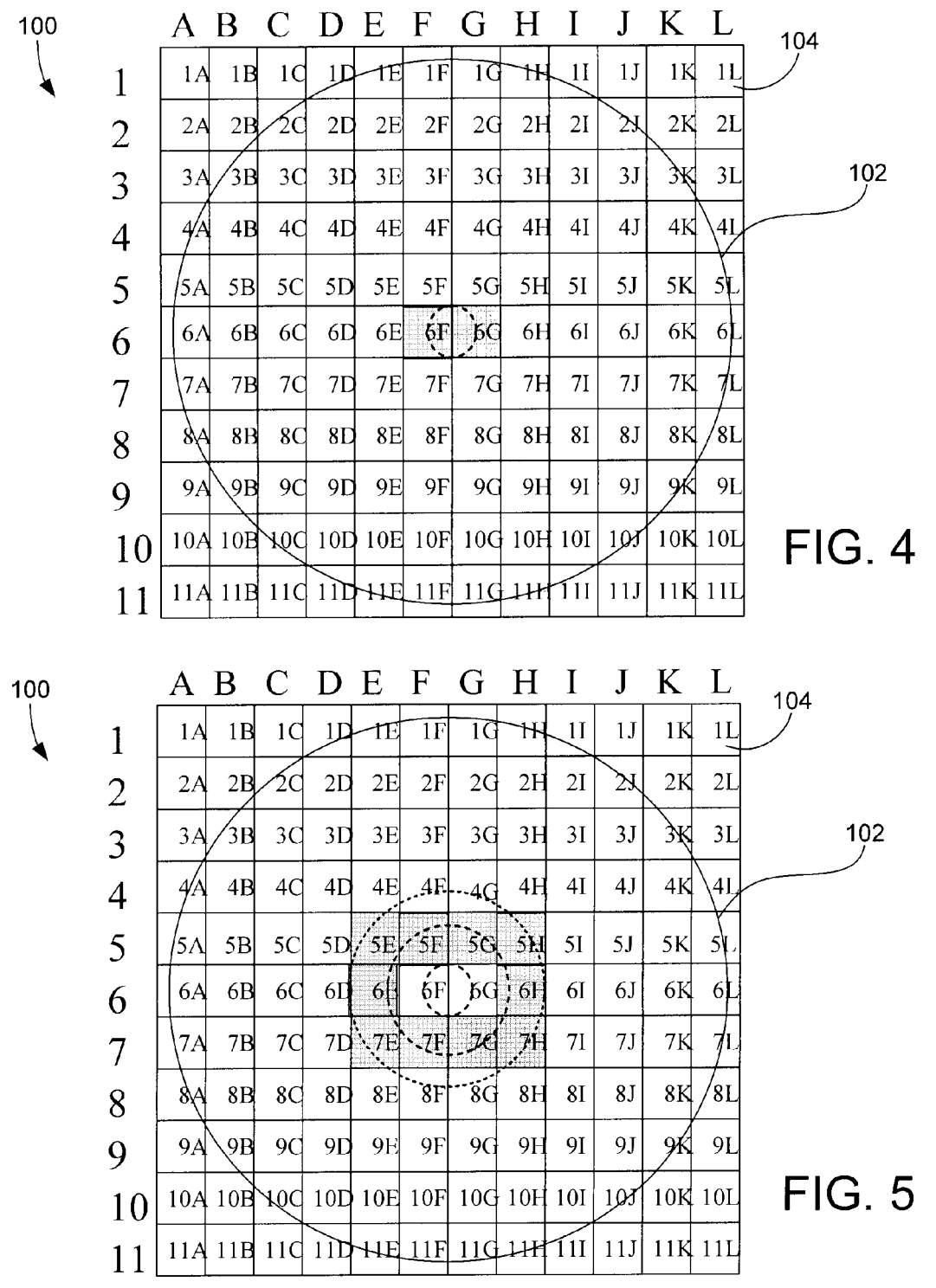

These and other issues are addressed by dividing (breaking) the original image pattern file into an array of adjacent tiles (tile files), as generally shown in FIG. 4. More specifically, FIG. 4 shows the image file 100 divided into a matrix of 11 rows (numbered 1-11) and 12 columns (numbered A-L) of tiles 104. While an 11×12 matrix size has been selected, such is merely for purposes of illustration and is not necessarily limiting. That is, while an unbalanced (n, n+1) set of rows and columns of tiles can be selected, other variants including but not limited to a balanced (n, n) set of rows and columns can be alternatively used.

Each of the tiles 104 in the exemplary 11×12 matrix in FIG. 4 is stored as a separate file of approximately 4.138 Gbytes in size. As shown for the tile designated as "5G," each tile provides a corresponding image size of about 1,666,666.67 pixels/8.33 mm by 1,818,181.81 pixels/9.09 mm. Partial pixels can be oversampled (i.e., included in each boundary tile), omitted, or "rounded." Thus, while it is contemplated that each tile 104 will have the exact same number of pixels, such is not necessarily required in that some tiles can have different numbers or pixels to account for such rounding issues.

Figure 6:
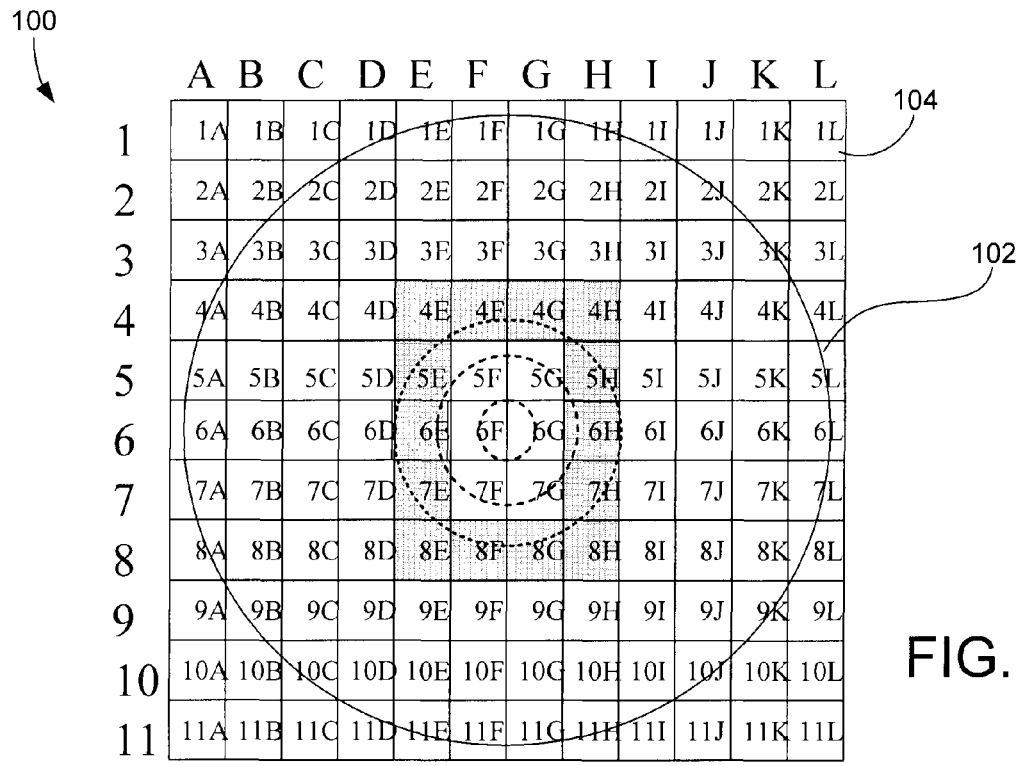
FIG. 6 provides the tiles of FIG. 5 with a third radial overlay concentric to the first and second overlays.

The image pattern 100 is preferably written to the circular substrate depicted by the overlay 102 in FIG. 2 as generally set forth by FIGS. 4-6. In FIG. 4, in order to write a pattern up to a first radius R1 (Radius 1), only two file tiles 6F and 6G will need to be opened at one time, since only pixels from these two tiles contribute to that portion of the image that falls within the R1 radius. This will require only about 8.276 Gbytes of available rapid random access memory.

FIG. 5 shows that to write a pattern up to a second radius R2 (Radius 2) will require access to the following additional tiles: 5G, 5H, 6H, 7H, 7G, 7F, 7E, 6E, 5E and 5F. This will require about 49.656 Gbytes of memory. FIG. 6 shows that to write a pattern up to a third radius R3 (Radius 3) will generally require concurrent access to the tiles 4G, 4H, 5H, 6H, 7H, 8H, 8G, 8F, 8E, 7E, 6E, 5E, 4E and 4F. This will require about 57.932 Gbytes of available rapid random access memory. Although not shown, the sequence continues for each new radius (zone) in turn until all of the desired image data have been transferred to the substrate.

It is noted that once the write operation has been moved to the zone between the second and third radii R2 and R3, the initially utilized tiles 6F and 6G are no longer needed in the local memory. Thus, as the write operation continues to concentrically move outwardly, increasingly larger numbers of tiles will generally need to be loaded into the local memory. At the same time, increasingly larger numbers of centrally located, previously utilized tiles can be removed from the memory, thereby freeing up space for the new tiles.

The write operation need not necessarily be initiated beginning in the center of the substrate, as shown by the sequence of FIGS. 4-6. Instead, any suitable starting location can be utilized, including but not limited to the outermost diameter (at which point the process begins to work inwardly). Generally, as noted above file tiles may be of any size, either larger or smaller than depicted in these figures. The size of the tiles can be selected in conjunction with the desired ranges (radial distances between adjacent "zones") so as to maximize memory storage efficiencies. The zones can further be changed in radial width (i.e., the radial distance from a radius N to the next radius N+1 can vary at different locations across the medium).

In sum, it can be seen that the exemplary solution illustrated by FIGS. 4-6 in recording a large (e.g., 500+Gbyte) pattern is to break it up into a number of smaller files organized as tiles of the master pattern, which are then loaded and discarded from local memory as needed.

Another issue associated with the transfer of the XY image pattern 100 to the associated rotating substrate relates to accurately achieving the desired initial XY pattern in view of the relative rotational path that the write beam will take relative to the rotating substrate. Generally, due to the rotating nature of the recording path, there will some measure of XY error introduced at each recording cell (image element on the associated substrate).

Figure 7:
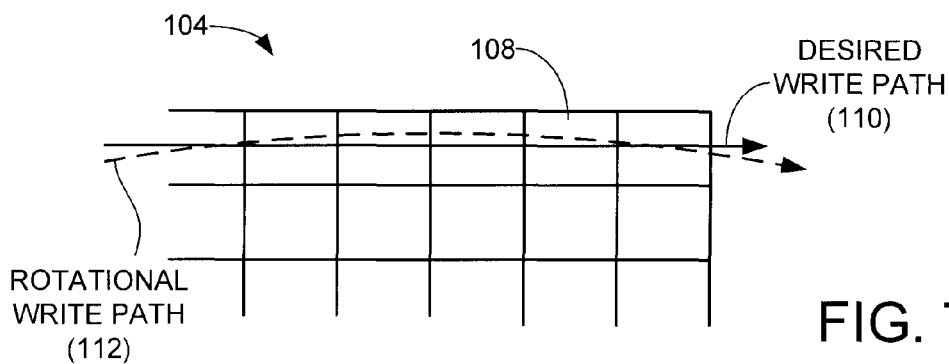
FIG. 7 depicts both a desired linear and an actual rotational write path for selected image elements of the image pattern.
Figure 8:
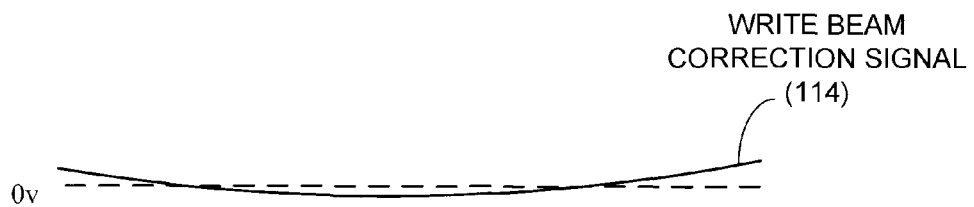
FIG. 8 provides a corresponding correction signal to compensate for differences between the respective paths in FIG. 7.

FIG. 7 shows a portion of a selected tile 104 and associated adjacent recording cells 108. A desired XY linear write path is denoted by the horizontal arrowed path 110. The actual recording path that the write beam will take along said cells 108 is denoted by the curvilinear arrowed path 112. To compensate for the differences between the respective paths 110, 112, a compensation signal 114 is generated, as depicted in FIG. 8, in order to deflect the recording beam into the correct position in each recording cell 108. While FIG. 8 only shows path compensation along one dimension, it is understood that a second path compensation signal can also be advantageously utilized in order to create true XY path correction. The solution to this second problem is thus to generate XY compensation signals, which are used to deflect the recording beam from the rotation writing path onto the desired XY pattern writing path.

Generally, it is contemplated that the amount of XY compensation required will be substantially zero at the horizontal and vertical axes of the XY pattern image due to the coincidence between the rotation writing path and the XY pattern cells at these locations.

However, the farther the recording substrate is positioned in between the horizontal and vertical axis, the greater the amount of XY compensation will be required with the greatest amount being required at around 45 degrees from the two primary axes. There may be some practical limitation on the distance that the recording beam can be deflected in either the X or Y directions. For example, the beam deflection may be limited to approximately the track pitch or space between two recording tracks. Therefore it may not be possible to provide total XY compensation using only beam deflection signals.

Figure 9:
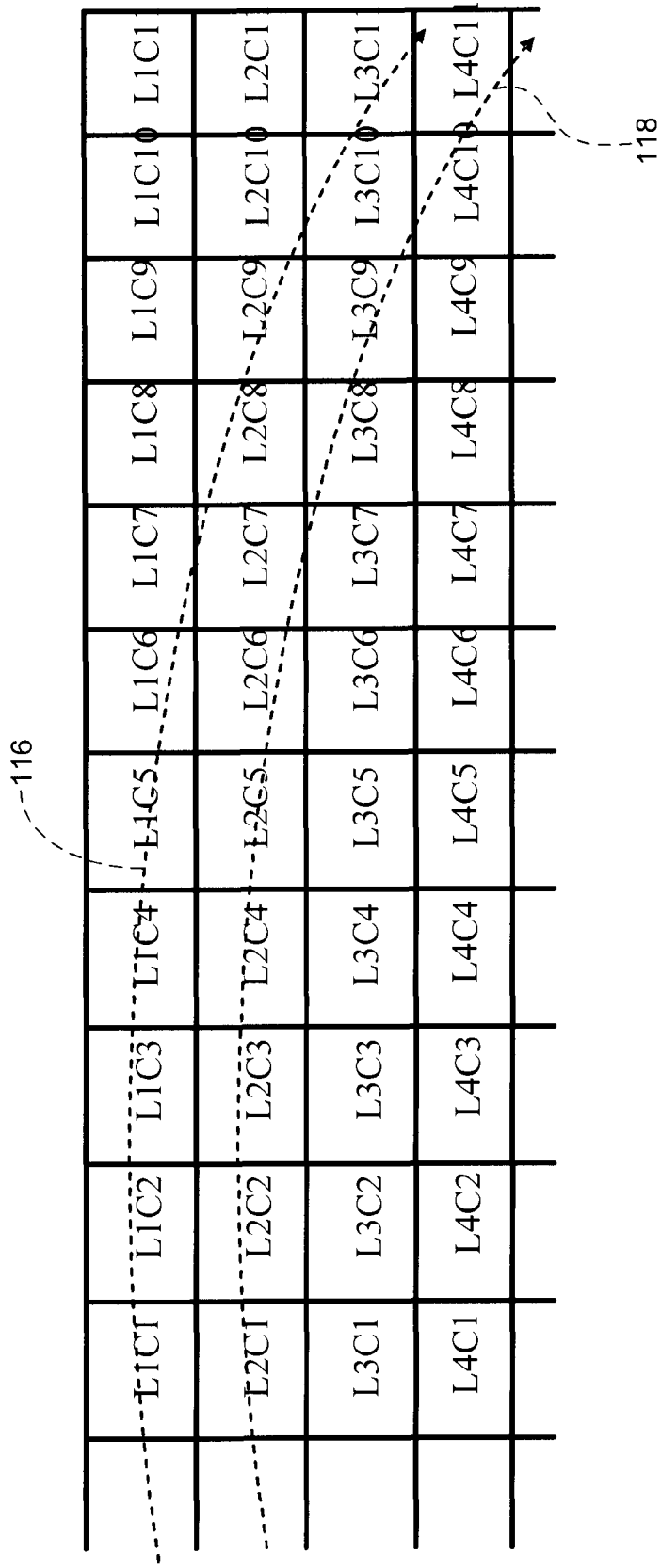
FIG. 9 shows an exemplary selection of image elements from a selected tile to write data as set forth in FIGS. 4-6.

Thus, further compensation can be supplied via reallocation of XY pattern cells into rotation-based recording cells, as generally shown in FIG. 9. This reallocation can be carried out during the creation of the tile files 104, or can be carried out on-the-fly during real-time recording. This latter is the presently preferred approach.

To explain an exemplary reallocation scheme, FIG. 9 shows certain ones of the various recording cells 108 of a selected tile. The cells 108 are arranged into lines "L" and columns "C." Thus, the cells 108 along the first line are denoted from L1C1 to L1C11; the cells 108 along the next adjacent line are denoted from L2C1 to L2C11, and so on. It will be appreciated that many more cells may be present for the amount of curvature shown in FIG. 9, so FIG. 9 is merely illustrative of the general approach.

A first recording path is denoted by arrowed path 116, and will utilize the following cell sequence: (L1C1, L1C2, L1C3, L1C4, L1C5, L1C6, L1C7, L2C8, L2C9, L2C10 and L3C11). A second adjacent recording path is denoted by arrowed path 118, and will utilize the following cell sequence: (L2C1, L2C2, L2C3, L2C4, L2C5, L2C6, L2C7, L3C8, L3C9, L3C10 and L4C11). The path at a given radius can be readily calculated to identify the associated recording cells that should be arranged therealong. The circumferential distance of the path at each given radius can also be evaluated in order to identify the number of cells that should be allocated. Generally, it is contemplated that as the radial paths increase in size, greater numbers of pixels (cells) will be incorporated therealong. In some embodiments, care is taken to ensure that every pixel is selected exactly one time, although in other embodiments pixels can be skipped or used more than once.

Figure 10:
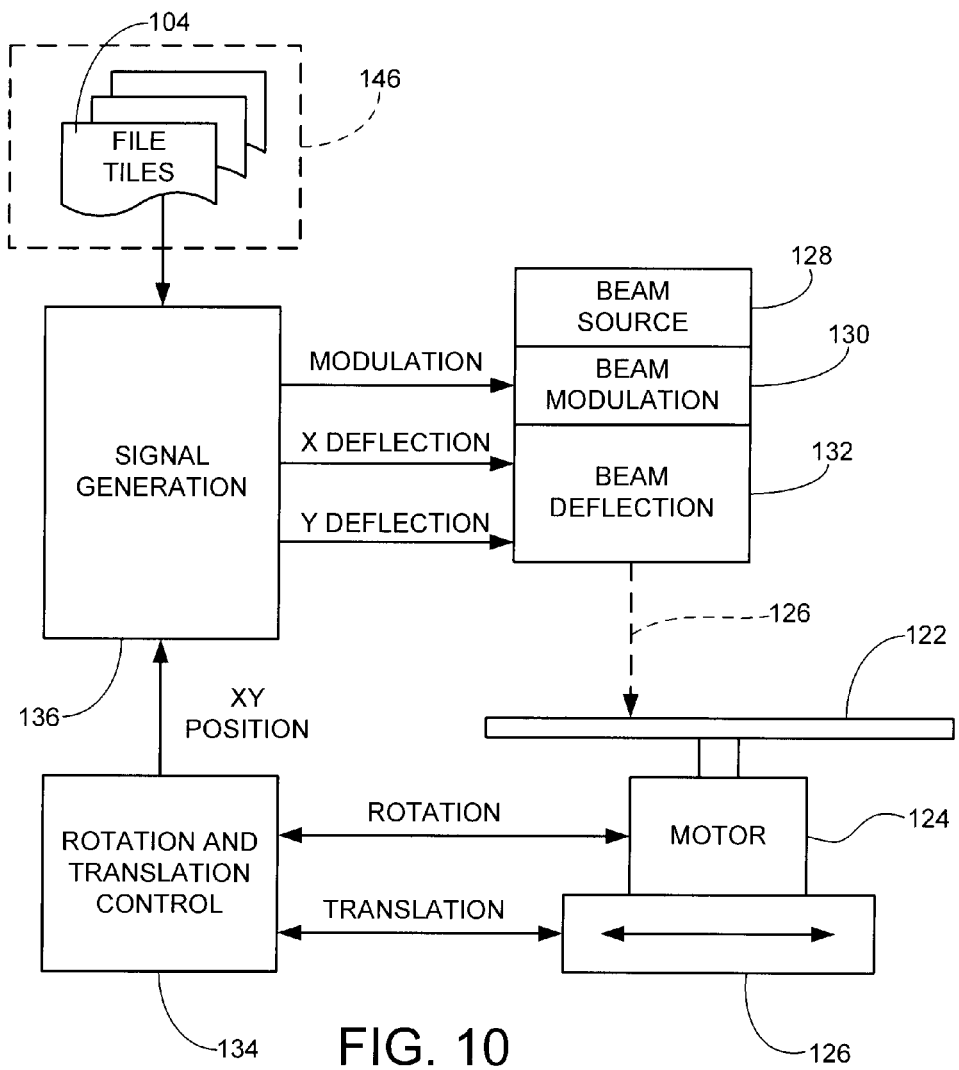
FIG. 10 shows a functional representation of an image transfer system which transfers an image such as set forth in FIG. 1 to a rotating substrate as set forth in FIG. 2.

FIG. 10 provides a functional block representation of a recording apparatus 120 configured to carry out a recording operation as set forth above upon a rotating substrate 122. The substrate 122 is rotated by a motor 124 at a selected rotational speed (which may be constant linear velocity or constant angular velocity, as desired). In some embodiments, the entire motor/substrate combination can further be translated along one more multiple axes via a translation mechanism 124.

The substrate 122 is configured to accept the transfer of the desired image (such as image pattern 100 in FIG. 1) via the selected exposure to a recording beam 126 supplied by a beam source 128. This transfer can take place in any number of ways, such as but not limited to exposure of a lithography mask, a layer of photoresist, exposure of a light sensitive dye layer, etc. The beam can be a laser or other optical instrument, an electron beam, a magnetic beam, etc.

A beam modulation block 130 modulates the beam 126, such as in an on/off configuration. In this way, each of the recording cells can be a binary pixel value (e.g., dark or light). This is not necessarily limiting, however, as gradients can alternatively be provided; that is, each pixel can alternatively represent some value along a spectrum of values for the image data. A beam deflection block 132 is coupled to the beam source and beam modulation blocks 128, 130 and is operative to deflect the beam along one or more desired axes (preferably, along each of the X and Y axial directions). The beam deflection can physically translate the beam source 128 or can utilize lenses, magnetic coils, etc. to precisely deflect the beam away from the initial path of the beam as provided by the source 128.

The apparatus of FIG. 10 further comprises a rotation and translation control block 134. The rotation and translation control block 134 controls the rotational speed of the substrate 122 via the motor 124, as well as the single or multi-axial translation of the motor/substrate via the translation block 126. The control block 134 further outputs a continuous sequence of XY position values to a signal generation block 136, which operates as a controller to provide top level control of the system. The signal generation block 136 can be realized as a programmable computer, but can alternatively constitute a hardware based controller.

Figure 11:
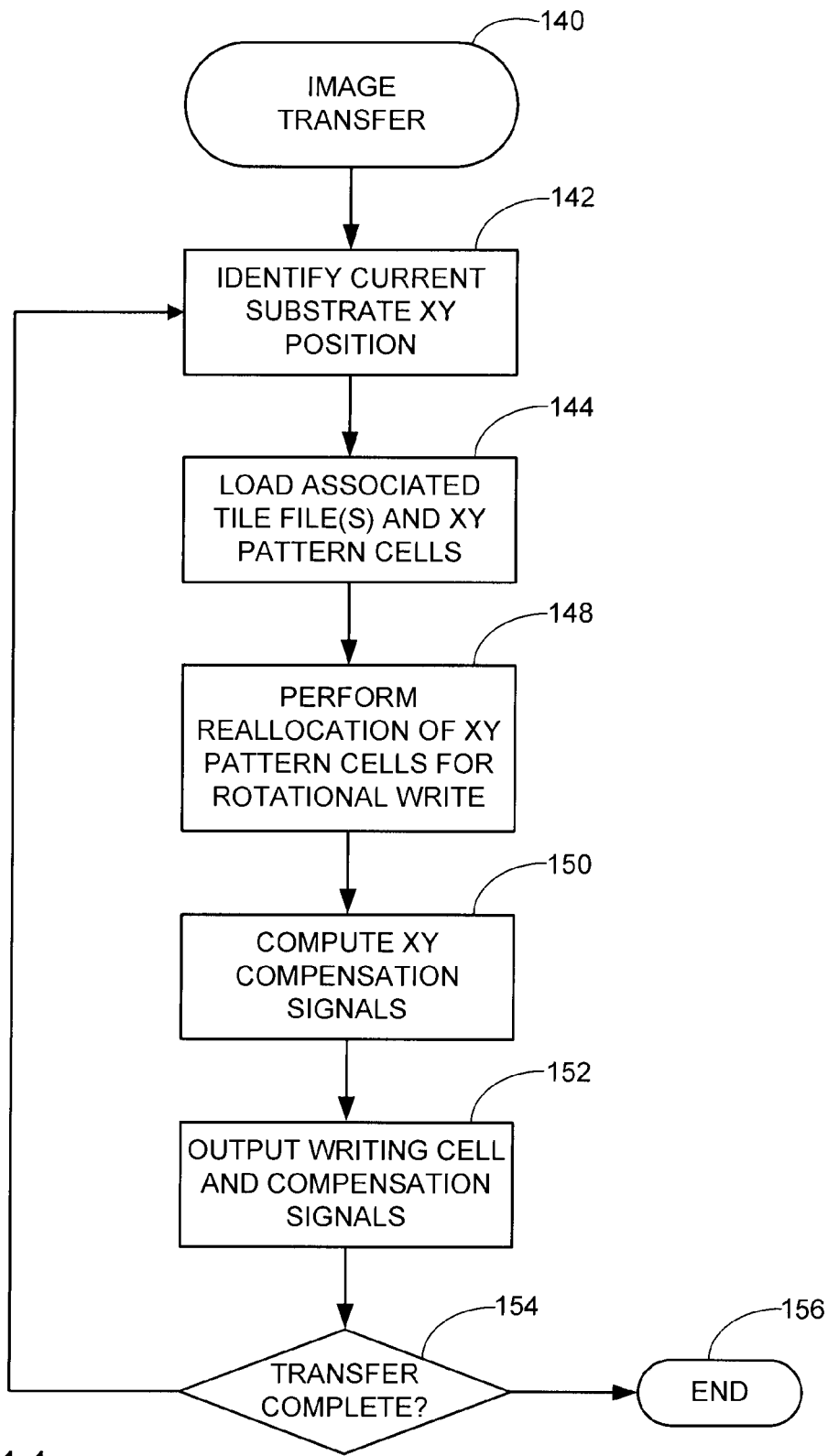
FIG. 11 is a flow chart for an IMAGE TRANSFER routine generally illustrative of steps carried out in accordance with various embodiments of the present invention.

Generally, the signal generation block 136 operates in accordance with an IMAGE TRANSFER routine 140 in FIG. 11. The current substrate XY position is initially identified at step 142. At step 144, the block 136 accesses from local memory 146 (FIG. 10) the associated tile file(s) and XY pattern cells associated with the current substrate position. In some embodiments, data are generated for all or a portion of the cells along a given rotational path (e.g., such as 116, 118 in FIG. 9). Step 144 thus may include the movement of new tiles into, and the jettisoning of old tiles out of, the local memory 146.

A reallocation of the cells takes place at step 148 to define the associated cells for the rotational path, as discussed above in FIG. 9. XY compensation signals are also preferably generated at step 150 as discussed above in FIGS. 7-8. The compensated write path cells are thereafter output at step 152.

With reference again to FIG. 10, the operation of step 152 in FIG. 11 generally includes the preferred operation of the signal generation block 136 to supply the appropriate modulation signals to the beam modulation block 130 for the sequence of cells; the supplying of appropriate X and Y compensation signals to the beam deflection block 132 and, as desired, control signals to the rotation and translation control block 134 to adjust the rotational speed of the substrate 122 via the motor 124 and/or the translation position of the substrate 122 via the translation block 126.

Continuing with the flow of FIG. 11, decision step 154 queries whether the transfer of the image data is complete; if not, the routine returns to step 142 for the next XY position of the substrate. Once all of the desired image data have been transferred to the substrate 122, the process ends as indicated by end step 156.

It will be appreciated by one skilled in the art that the tile files can be obtained ahead of time and buffered locally in the recording control system. The XY compensation signals do not need to be computed individually for each recording cell, but can also be obtained from a function generator which is synchronized to the rotation and translation of the recording substrate.

It is intended that the above teaching and apparatus can be used in all recording rotation modes including CLV (Constant Linear Velocity) and CAV (Constant Angular Velocity). It is intended that the above teaching and apparatus can be used in concentric track recording modes as well as continuous track recording modes.

While the various embodiments discussed herein have contemplated the use of a circular substrate, it will be appreciated that such is merely by way of illustration and is not limiting to the scope of the claimed subject matter. Rather, any number of substrates can be processed with the system 120 of FIG. 10, including but not limited to the various shapes set forth in FIGS. 12A-D.

Figure 12A:
FIGS. 12A-12D show alternative exemplary shapes of rotatable substrates to which image patterns can be written using the system of FIG. 10.
Figure 12B:
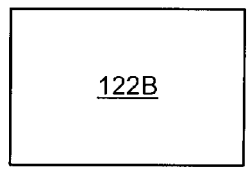
Figure 12C:
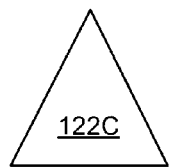
Figure 12D:
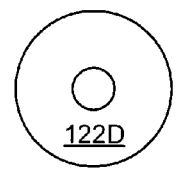

FIG. 12A shows a substantially square substrate 122A. This substrate is contemplated as having the same size and aspect ratio as the original image pattern 100 in FIG. 1. Thus, the system of FIG. 10 can be readily adapted to quickly and easily transfer the entire image of the pattern file to this substrate. FIG. 12B shows a rectangular substrate 122B. The rectangular substrate can have the image written to a square portion thereof so that there remains a remaining portion of the rectangular substrate 122B that is not exposed to the desired image. Alternatively, a "zoom" function can be used such that all of the rectangular substrate 122B displays image data from the image pattern 100 (with a portion of the image truncated). FIG. 12C shows a triangular substrate 122C, and FIG. 12D shows a circular substrate 122D with a central aperture therethrough. These and other substrates can readily be written to as set forth above.

It will now be appreciated that the various embodiments disclosed herein provide advantages over the art of record. Creating tile files from a larger master file allows smaller portions of the overall data to be moved into local memory, as required. XY compensation and cell reallocation techniques can further be used to reduce amounts of distortion in the resulting transferred image. The embodiments disclosed herein can advantageously transfer images as desired to any number of different types of media, as desired.

For purposes herein, it will be appreciated that the use of the term "image" will be understood broadly to include, but not be limited to, graphical works or displays of pixels that can be viewed by a human observer to provide intelligible content. Thus for example, the image could alternatively be used to provide an exposure layer in a semiconductor device, a data pattern or mark on a recording medium, etc. Similarly, while the exemplary image data presented herein such as at 100 have constituted a square image, such is not limiting, as any number of other data arrangements of the initial master image pattern can be provided as desired.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
dividing an XY image pattern comprising a plurality of image elements into a matrix of adjacent tiles; and
using a write beam to write the XY image pattern to a rotating substrate by defining a radial path at a selected radius of the rotating substrate, identifying the tiles of said matrix that intersect said radial path, and writing a portion of the XY image pattern at the selected radius using image elements from the identified tiles, wherein during the using step the identified tiles are moved into a random access memory, and wherein tiles in the matrix not intersected by said path are not present in or are discarded from said memory.

2. The method of claim 1, wherein the using step comprises sequentially defining a succession of concentric radial paths each having a different radius on the rotating substrate, identifying a different set of tiles in the matrix that intersect each of the succession of concentric radial paths, and using image elements from the respective different sets of tiles to write different portions of the XY image pattern.

3. The method of claim 1, wherein the XY image pattern comprises a first total number of rows of image elements in the X direction and a second total number of columns of image elements in the Y direction, and wherein the matrix of adjacent tiles comprises a third number of rows of tiles in the X direction and a fourth number of columns of tiles in the Y direction.

4. The method of claim 3, wherein the first number is equal to the second number, and the third number is different from the fourth number.

5. The method of claim 1, wherein the using step further comprises generating a compensation signal to deflect the write beam as the substrate rotates adjacent thereto such that the write beam is continuously deflected to write a linear sequence of image elements to the substrate.

6. The method of claim 1, wherein the using step further comprises reallocating image elements from the identified tiles that intersect the radial path and sequentially writing said image elements to the substrate.

7. The method of claim 1, wherein the using step further comprises linearly translating the rotating medium during said writing.

8. An apparatus comprising a write system which divides an XY image pattern into a matrix of adjacent tiles and which modulates a write beam to write the XY image pattern to a rotating substrate by defining a radial path at a selected radius of the rotating substrate, identifying the tiles of said matrix that intersect said radial path, and writing a portion of the XY image pattern at the selected radius using image elements from the identified tiles, the XY image pattern comprising a first total number of rows of image elements in the X direction and a second total number of columns of image elements in the Y direction, the matrix of adjacent tiles comprising a third number of rows of tiles in the X direction and a fourth number of columns of tiles in the Y direction.

9. The apparatus of claim 8, further comprising a motor configured to controllably rotate the substrate adjacent the write beam.

10. The apparatus of claim 9, further comprising a translation block supporting the motor which selectively translates the substrate during said writing of the image pattern.

11. The apparatus of claim 8, further comprising a beam modulation block which modulates the write beam responsive to the image pattern.

12. The apparatus of claim 8, further comprising a beam deflection block which deflects the write beam responsive to correction signals generated by a signal generator of the write system.

13. The apparatus of claim 8, further comprising a random access memory, wherein the write system moves the identified tiles into the random access memory and discards tiles in the matrix not intersected by said path from said memory.

14. The apparatus of claim 8, wherein the write system defines a succession of concentric radial paths each having a different radius on the rotating substrate, identifies a different set of tiles in the matrix that intersect each of the succession of concentric radial paths, and writes a different portion of the XY image pattern along to each successive concentric radial path using image elements from the associated set of tiles intersecting said path.

15. The apparatus of claim 14, wherein the first number is equal to the second number, and the third number is different from the fourth number.

16. The apparatus of claim 8, wherein the write system comprises a signal generator which generates a compensation signal to deflect the write beam as the substrate rotates adjacent thereto such that the write beam is continuously deflected to write a linear sequence of image elements to the substrate.

17. The apparatus of claim 16, wherein the signal generator further selectively reallocates image elements from the identified tiles that intersect the radial path and sequentially modulates the write beam to write said image elements to the substrate.

18. An apparatus comprising:
   a rotating substrate; and
   a write system adapted to write an XY image pattern to the rotating substrate by dividing the XY image pattern into a matrix of adjacent tiles, defining a radial path at a selected radius of the rotating substrate, identifying the tiles of the matrix that intersect the defined radial path, and writing a portion of the XY image pattern at the selected radius using image elements from the identified tiles, wherein the write system reallocates image elements from the identified tiles that intersect the radial path and sequentially writes said image elements to the substrate.

19. The apparatus of claim 18, wherein the XY image pattern comprises a first total number of rows of image elements in the X direction and a second total number of columns of image elements in the Y direction, the matrix of adjacent tiles comprising a third number of rows of tiles in the X direction and a fourth number of columns of tiles in the Y direction.

20. The apparatus of claim 19, wherein the write system comprises a signal generator which generates beam deflection signals to deflect a write beam to write the image pattern along a linear path across the substrate.

* * * * *